US008640582B2

(12) United States Patent
Saimen (10) Patent No.: US 8,640,582 B2
(45) Date of Patent: Feb. 4, 2014

(54) METHOD FOR MANUFACTURING FLEXIBLE SUBSTRATE AND FLEXIBLE SUBSTRATE PUNCHING DEVICE

(75) Inventor: Munehide Saimen, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1250 days.

(21) Appl. No.: 12/350,775

(22) Filed: Jan. 8, 2009

(65) Prior Publication Data

US 2009/0178522 A1 Jul. 16, 2009

(30) Foreign Application Priority Data

Jan. 11, 2008 (JP) .................................. 2008-004048

(51) Int. Cl.
*B26F 1/02* (2006.01)
*B26D 5/00* (2006.01)

(52) U.S. Cl.
USPC .................. 83/49; 83/76.8; 83/72; 83/370

(58) Field of Classification Search
USPC ............. 83/27, 40, 41, 49, 50, 53, 55, 72–77, 83/103, 405, 667, 916, 862, 865, 358–372, 83/213, 214, 656, 71.6–76.8
See application file for complete search history.

(56) References Cited

U.S. PATENT DOCUMENTS

| | | | | |
|---|---|---|---|---|
| 3,491,437 A | * | 1/1970 | Small | 29/602.1 |
| 4,046,040 A | * | 9/1977 | Bourdo | 83/63 |
| 4,344,342 A | * | 8/1982 | Garvin | 83/45 |
| 5,017,792 A | * | 5/1991 | Walters | 250/548 |
| 5,562,008 A | * | 10/1996 | Lordo | 83/39 |
| 5,699,946 A | * | 12/1997 | Hashimoto et al. | 225/1 |
| 6,041,271 A | * | 3/2000 | Lindstrom | 700/175 |
| 6,598,505 B2 | * | 7/2003 | Henderson et al. | 83/13 |
| 6,874,395 B2 | * | 4/2005 | Ishii et al. | 83/13 |
| 6,925,916 B2 | * | 8/2005 | Duggins et al. | 83/13 |
| 8,098,923 B2 | * | 1/2012 | Bytow | 382/141 |

FOREIGN PATENT DOCUMENTS

| | | |
|---|---|---|
| JP | 06-132618 A | 5/1994 |
| JP | 10-209601 A | 8/1998 |
| JP | 2007-069312 A | 3/2007 |

OTHER PUBLICATIONS

JP06-132618 tranlation, May 13, 1994; Hirooka et al.*

* cited by examiner

*Primary Examiner* — Laura M Lee
(74) *Attorney, Agent, or Firm* — Kilpatrick Townsend & Stockton LLP (57) ABSTRACT

A method for manufacturing a flexible substrate includes punching out a flexible substrate from a flexible tape wherein the flexible substrate has a first contour that is a part of a contour of the flexible substrate, and a second contour that is a remaining portion of the contour other than the first contour, and requires a punching accuracy lower than a punching accuracy of the first contour. The method includes the steps of: operating a first die by a control section to punch out the first contour from the flexible tape; judging by the control section as to whether a punching accuracy of the first contour meets a standard; and operating a second die by the control section to punch out the second contour from the flexible tape thereby separating the flexible substrate from the flexible tape when the control section judges that the punching accuracy of the first contour meets the standard, and not operate the second die when the control section judges that the punching accuracy of the first contour does not meet the standard.

4 Claims, 7 Drawing Sheets

METHOD FOR MANUFACTURING FLEXIBLE SUBSTRATE AND FLEXIBLE SUBSTRATE PUNCHING DEVICE

The entire disclosure of Japanese Patent Application No. 2008-004048, filed, Jan. 11, 2008 is expressly incorporated by reference herein.

BACKGROUND

1. Technical Field

The present invention relates to methods for manufacturing flexible substrates and flexible substrate punching devices. In particular, the invention relates to methods for manufacturing flexible substrates and flexible substrate punching devices which can readily sort out defective articles.

2. Related Art

Figure 7:
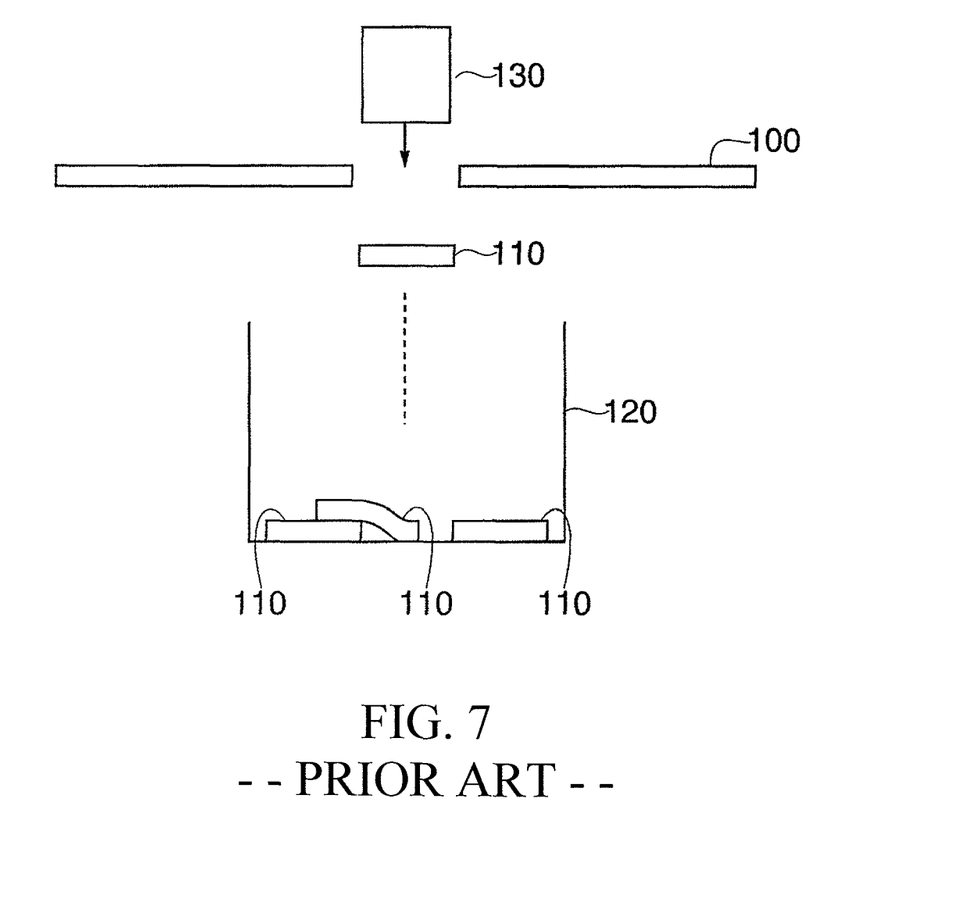
FIG. 7 is a schematic diagram for describing a manufacturing method for manufacturing flexible substrates in related art.

FIG. 7 is a schematic diagram for describing a method for manufacturing a flexible substrate in related art. According to the illustrated method for manufacturing flexible substrates 110, a flexible tape 100 having wiring patterns and external connection terminals (not shown in the figure) formed in advance thereon is punched out by a die 130, thereby manufacturing flexible substrates 110 (see, for example, Japanese Laid-open Patent Application 2000-069312). The flexible substrates 110 punched out by the die 130 are stored in a container 120 disposed below the die 130.

When the accuracy of punching position of a flexible substrate with respect to a flexible tape does not meet the standard, the position of an external connection terminal with reference to the contour of the flexible substrate do not meet the standard, and therefore such a flexible substrate needs to be sorted out as a defective article. However, in accordance with the method for manufacturing flexible substrates in related art, defective articles and non-defective articles are stored in the same container, and selection of defective articles from non-defective articles is difficult.

SUMMARY

In accordance with an advantage of some aspects of the invention, a method for manufacturing flexible substrates and a flexible substrate punching device capable of readily sorting out defective articles can be provided.

A method for manufacturing a flexible substrate in accordance with an embodiment of the invention pertains to a method for manufacturing a flexible substrate in which a flexible substrate is punched out from a flexible tape, wherein the flexible substrate has a first contour that is a part of a contour of the flexible substrate, and a second contour that is a remaining portion of the contour other than the first contour, and requires a punching accuracy lower than a punching accuracy of the first contour, the method including the steps in which: a control section operates a first die to punch out the first contour from the flexible tape; the control section judges as to whether a punching accuracy of the first contour meets a standard; and the control section operates a second die to punch out the second contour from the flexible tape thereby separating the flexible substrate from the flexible tape when the control section judges that the punching accuracy of the first contour meets the standard, and has the second die not operate when the control section judges that the punching accuracy of the first contour does not meet the standard.

According to the method for manufacturing a flexible substrate, the first contour that requires a relatively high punching accuracy is punched out first, and the second die is not operated when the punching accuracy of the first contour does not meet the standard. Therefore, flexible substrates that are defective are not separated from the flexible tape. Therefore, defective articles can be readily sorted out.

In accordance with an aspect of the embodiment, the flexible tape may be provided with a reference pattern of a simpler configuration than that of the first contour in an area other than an area of the flexible substrate to be punched out. In this case, the control section may control, in the step of punching out the first contour, the first die to punch out the first contour and the reference pattern. In the step of judging as to whether the punching accuracy of the first contour meets the standard, the control section may measure the punching accuracy of the reference pattern by image processing to judge as to whether the punching accuracy meets the standard.

A method for manufacturing a flexible substrate in accordance with another embodiment of the invention pertains to a method for manufacturing a flexible substrate in which a first flexible substrate is punched out from a first area of a flexible tape, and then a second flexible substrate having an identical shape as that of the first flexible substrate is punched out from a second area of the flexible tape, wherein each of the first flexible substrate and the second flexible substrate has a first contour and a second contour that is a remaining portion of the entire contour other than the first contour, and requires a punching accuracy lower than a punching accuracy of the first contour, and the first contour is punched out by a first die, and the second contour is punched out by a second die that is positioned in a location different from the first die and is operated simultaneously with the first die, the method including the steps in which:

a control section controls a moving device that relatively moves the flexible tape with respect to the first die and the second die to position the first area at a position below the first die;

the control section operates the first die to punch out the first contour of the first flexible substrate from the flexible tape;

the control section judges as to whether a punching accuracy of the first contour of the first flexible substrate meets a standard;

the control section controls the moving device to position the first area below the second die, and position the second area below the first die;

the control section operates the first die and the second die to punch out the second contour of the first flexible substrate and punch out the first contour of the second flexible substrate, when the control section judges that the punching accuracy of the first contour of the first flexible substrate meets the standard, and outputs an alarm signal without operating the first die or the second die when the control section judges that the punching accuracy of the first contour of the first flexible substrate does not meet the standard;

the control section judges as to whether a punching accuracy of the first contour of the second flexible substrate meets a standard when the second contour of the first flexible substrate and the first contour of the second flexible substrate are punched out;

the control section controls the moving device to position the second area below the second die; and the control section operates the second die to punch out the second contour of the second flexible substrate, when the control section judges that the punching accuracy of the first contour of the second flexible substrate meets the standard.

A method for manufacturing a flexible substrate in accordance with still another embodiment of the invention pertains to a method for manufacturing a flexible substrate in which a first flexible substrate and then a second flexible substrate having an identical shape as that of the first flexible substrate are punched out in this order from a flexible tape, wherein each of the first flexible substrate and the second flexible substrate has a first contour and a second contour that is a remaining portion of the entire contour other than the first contour, and requires a punching accuracy lower than a punching accuracy of the first contour, and the first contour is punched out by a first die, the method including the steps in which:

a control section operates a first die to punch out the first contour of the first flexible substrate from the flexible tape;

the control section judges as to whether a punching accuracy of the first contour of the first flexible substrate meets a standard;

the control section operates the first die and the second die to punch out the second contour of the first flexible substrate and punch out the first contour of the second flexible substrate, when the control section judges that the punching accuracy of the first contour of the first flexible substrate meets the standard, and the control section operates only the first die to punch out the first contour of the second flexible substrate while leaving the first flexible substrate connected to the flexible tape when the control section judges that the punching accuracy of the first contour of the first flexible substrate does not meet the standard;

the control section judges as to whether a punching accuracy of the first contour of the second flexible substrate meets a standard; and the control section operates the second die to punch out the second contour of the second flexible substrate when the control section judges that the punching accuracy of the first contour of the second flexible substrate meets the standard, and the control section does not operate the second die to keep the second flexible substrate connected to the flexible tape when the control section judges that the punching accuracy of the first contour of the second flexible substrate does not meet the standard.

According to the method for manufacturing a flexible substrate, defective flexible substrates are not separated from the flexible tape by the second die. Accordingly, defective articles can be readily sorted out. Also, at the time of punching out the second contour of the first flexible substrate, the first contour of the second flexible substrate can be punched out, such that the efficiency in manufacturing flexible substrates is improved.

A punching device in accordance with an embodiment of the invention pertains to a punching device that punches out a flexible substrate from a flexible tape, wherein the flexible substrate has a first contour that is a part of a contour of the flexible substrate, and a second contour that is a remaining portion of the contour other than the first contour, and requires a punching accuracy lower than a punching accuracy of the first contour, the punching device including:

a first die that punches out the first contour from the flexible tape;

a second die that punches out the second contour from the flexible tape;

a moving device that relatively moves the flexible tape from below the first die to below the second die;

a control section that controls operations of the moving device, the first die and the second die, thereby punching out the first contour and then the second contour to separate the flexible substrate from the flexible tape; and a calculating device that calculates a punching accuracy of the first contour in the flexible substrate when the first contour is punched out and before the second contour is punched out, wherein the control section operates the second die to punch out the second contour upon judging that the punching accuracy meets a standard, but does not operate the second die upon judging that the punching accuracy does not meet the standard.

A punching device in accordance with an embodiment of the invention pertains to a punching device that punches out a first flexible substrate from a first area of a flexible tape, and then punching out a second flexible substrate having an identical shape as that of the first flexible substrate from a second area of the flexible tape, wherein each of the first flexible substrate and the second flexible substrate has a first contour and a second contour that is a remaining portion of the entire contour other than the first contour, and requires a punching accuracy lower than a punching accuracy of the first contour, the punching device including:

a first die that punches out the first contour from the flexible tape;

a second die that operates simultaneously with the first die and punches out the second contour from the flexible tape;

a moving device that relatively moves the flexible tape from below the first die to below the second die;

a control section that controls operations of the moving device, the first die and the second die; and a calculation device that calculates a punching accuracy of the first contour in each of the first flexible substrate and the second flexible substrate when the first contour is punched out but before punching out the second contour, wherein the control section controls the moving device to position the first area blow the first die, and then operates the first die to punch out the first contour of the first flexible substrate from the flexible tape, and thereafter the control section controls the moving device to position the first area below the second die, and position the second area below the first die, when it is judged that the punching accuracy of the first contour of the first flexible substrate calculated by the calculation device meets the standard, the control section operates the first die and the second die to punch out the second contour of the first flexible substrate and the first contour of the second flexible substrate, when it is judged that the punching accuracy of the first contour of the first flexible substrate calculated by the calculation device does not meet the standard, the control section outputs an alarm signal without operating the first die and the second die, when the second contour of the first flexible substrate and the first contour of the first flexible substrate are punched out, the control section controls the moving device to position the second area below the second die, and when it is judged that the punching accuracy of the first contour of the second flexible substrate calculated by the calculation device, the control device operates the second die to punch out the second contour of the second flexible substrate.

A punching device in with an embodiment of the invention pertains to a punching device that punches out a first flexible substrate and then a second flexible substrate having an identical shape as that of the first flexible substrate from a flexible tape, wherein each of the first flexible substrate and the second flexible substrate has a first contour and a second contour that is a remaining portion of the entire contour other than the first contour, and requires a punching accuracy lower than a punching accuracy of the first contour, the punching device including:

a first die that punches out the first contour from the flexible tape;

a second die that punches out the second contour from the flexible tape;

a moving device that relatively moves the flexible tape from below the first die to below the second die;

a control section that controls operations of the moving device, the first die and the second die; and a calculation device that calculates a punching accuracy of the first contour in each of the first flexible substrate and the second flexible substrate when the first contour is punched out but before the second contour is punched out, wherein the control section operates the first die and the second die to punch out the second contour of the first flexible substrate and punch out the first contour of the second flexible substrate, when the control section judges that the punching accuracy of the first contour of the first flexible substrate meets the standard, and the control section operates only the first die to punch out the first contour of the second flexible substrate while leaving the first flexible substrate connected to the flexible tape, when the control section judges that the punching accuracy of the first contour of the first flexible substrate does not meet the standard.

DESCRIPTION OF EXEMPLARY EMBODIMENTS

A punching method for punching out flexible substrates 10 in accordance with an embodiment of the invention is described below with reference to the accompanying drawings. The method of the invention pertains to a method for manufacturing flexible substrates 10, through punching out the flexible substrates from a flexible tape 1. According to the method of the invention, a portion of the contour of the flexible substrate 10 which requires a higher accuracy compared to another portion of the contour is punched out first, then the positional accuracy in punching out this portion is measured, and the remaining portion of the contour is punched out when the measured accuracy meets a specified standard. Therefore, when the positional accuracy of the portion punched out first does not meet the standard, the flexible substrate 10 remains being connected to the flexible tape 1. Accordingly, defective articles can be readily sorted out. The method is described below in greater detail.

Figure 1:
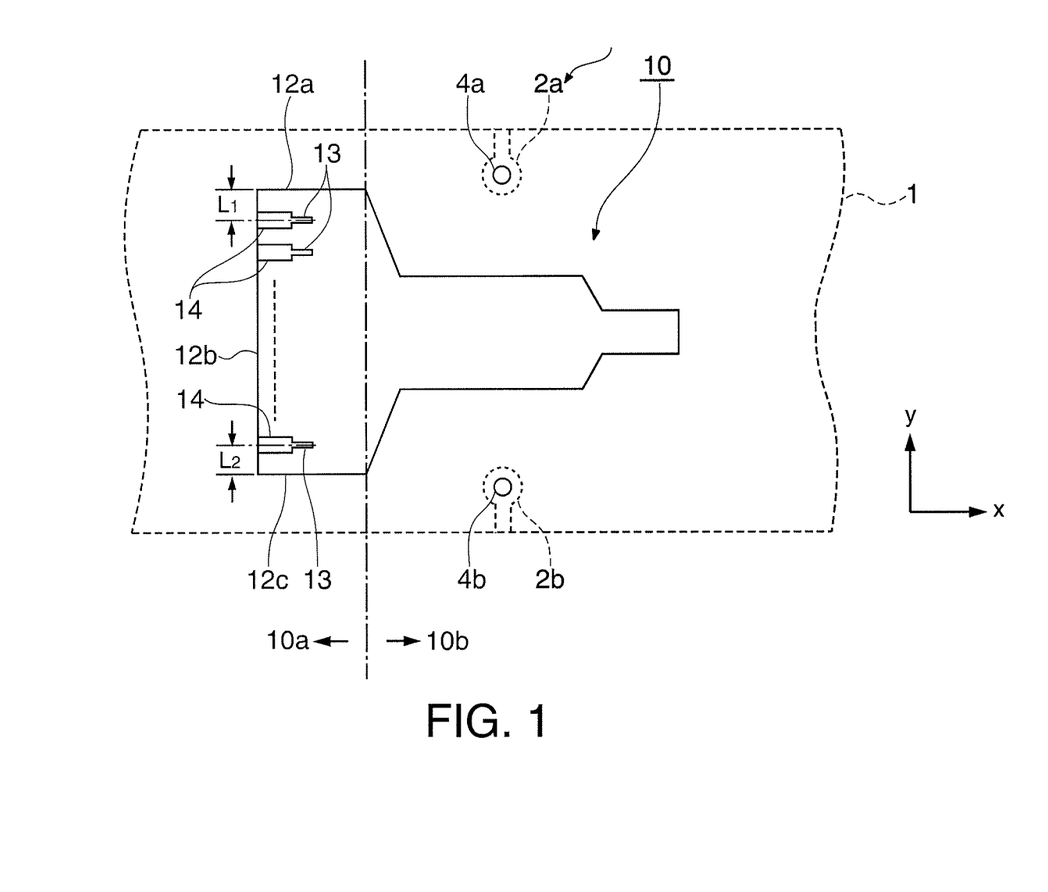
FIG. 1 is a schematic plan view of the structure of a flexible substrate 10.

FIG. 1 is a schematic plan view for describing the structure of the flexible substrate 10. The figure shows a flexible tape 1 in a dotted line, for the purpose of description. The flexible substrate 10 is a substrate for mounting, for example, a semiconductor chip thereon in a TCP mounting system, a COF mounting system, or a TCM (Tape Carrier Module) mounting system, and includes a wiring pattern 13 to be connected to the semiconductor chip and a plurality of external connection terminals 14 to be connected to the wiring pattern 13.

The external connection terminals 14 may be, for example, gold patterns, and may be provided at a socket 10a that forms a part of the flexible substrate 10. The socket 10a defines its shape by a side 12b that is orthogonal to an insertion direction of the socket 10a, and sides 12a and 12c that extend in parallel with the insertion direction of the socket 10a. The plurality of external connection terminals 14 are arranged in a row along the side 12b. A distance $L_1$ from the center of one of the external connection terminals closest to the side 12a to the side 12a, and a distance $L_2$ from the center of one of the external connection terminals closest to the side 12c to the side 12c require a high level of accuracy. Therefore, in accordance with an aspect of the present embodiment, the sides 12a, 12b and 12c that define a contour of the socket 10a are punched out first, and when the punching accuracy meets the specified standard, the contour of the remaining portion 10b is punched out.

Also the flexible tape 1 is provided with circular patterns 2a and 2b for confirming the accuracy of punching position formed in an area other than the area where the flexible substrate 10 is punched out. The patterns 2a and 2b may be provided adjacent to two long sides of the flexible tape 2, respectively. The patterns 2a and 2b may be formed in the step of forming the external connection terminals 14, and circular openings 4a and 4b are formed by punching portions of the flexible tape 2 when the contour of the socket 10a is punched out. A die for punching out the contour of the socket 10a and a die for punching out the patterns 2a and 2b are formed in one piece. Therefore, by measuring a difference between the center of the pattern 2a and the center of the opening 4a, and a difference between the center of the pattern 2b and the center of the opening 4b, the punching accuracy of the contour of the socket 10a can be measured. More specifically, an x-axis component, a y-axis component and a rotational component of the positional accuracy of the contour of the socket 10a can be measured. It is noted that, when there is no error in the punching position, the centers of the pattern 2a and the opening 4a are superposed each other, and the centers of the pattern 2b and the opening 4b are superposed each other.

Figure 2:
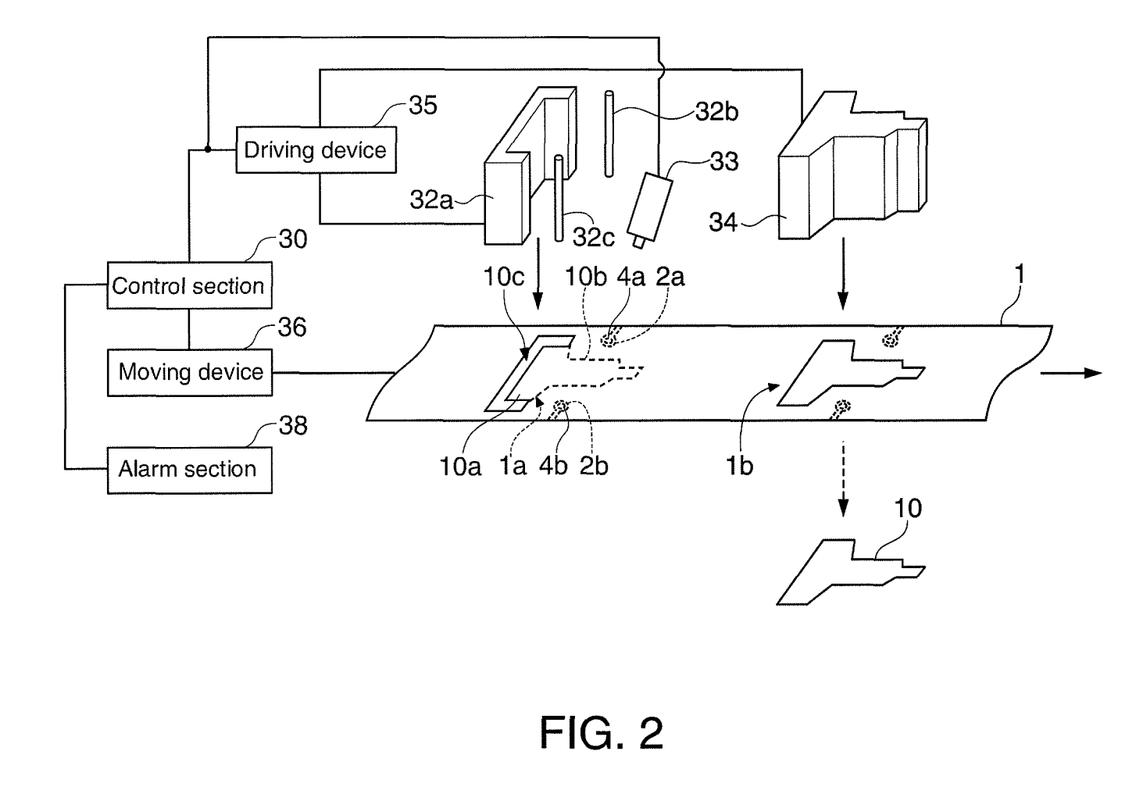
FIG. 2 is a schematic diagram of the structure of a flexible substrate punching device.

FIG. 2 is a schematic diagram for describing the structure of a flexible substrate punching device that punches out flexible substrates 10 from a flexible tape 1. The flexible substrate punching device shown in the figure includes a die 32a that first punches out the contour of the socket 10a of the flexible substrate 10, dies 32b and 32c for forming openings 4a and 4b in the flexible tape 1, a die 34 that is located in a place different from the die 32a for punching out a remaining portion 10b of the flexible substrate 10, a driving device 35 that simultaneously drives the dies 32a, 32b, 32c and 34, a moving device 36 that moves the flexible tape 1 from a position below the dies 32a, 32b and 32c toward a position below the die 34, an alarm section 38 that provides an alarm output, and a control device 30 that controls operations of the driving device 35, the moving device 36, and the alarm section 38. The alarm section 38 may be formed from an alarm lamp and a voice generation device. The dies 32a, 32b and 32c are connected to each other in one piece in portions which are not shown in the figure.

The punching device also includes an imaging device 33 that captures images of the openings 4a and 4b and the patterns 2a and 2b and generates image data thereof. The image data generated by the imaging device 33 is transmitted to the control section 30. The control section 30 processes the image data received, thereby calculating a difference between the center of the pattern 2a and the center of the opening 4a and a difference between the center of the pattern 2b and the center of the opening 4b. Furthermore, the control section 30 calculates, based on the calculation results, an x-axis component, a y-axis component and a rotational component of the positional accuracy of the contour of the socket 10a.

Figure 3:
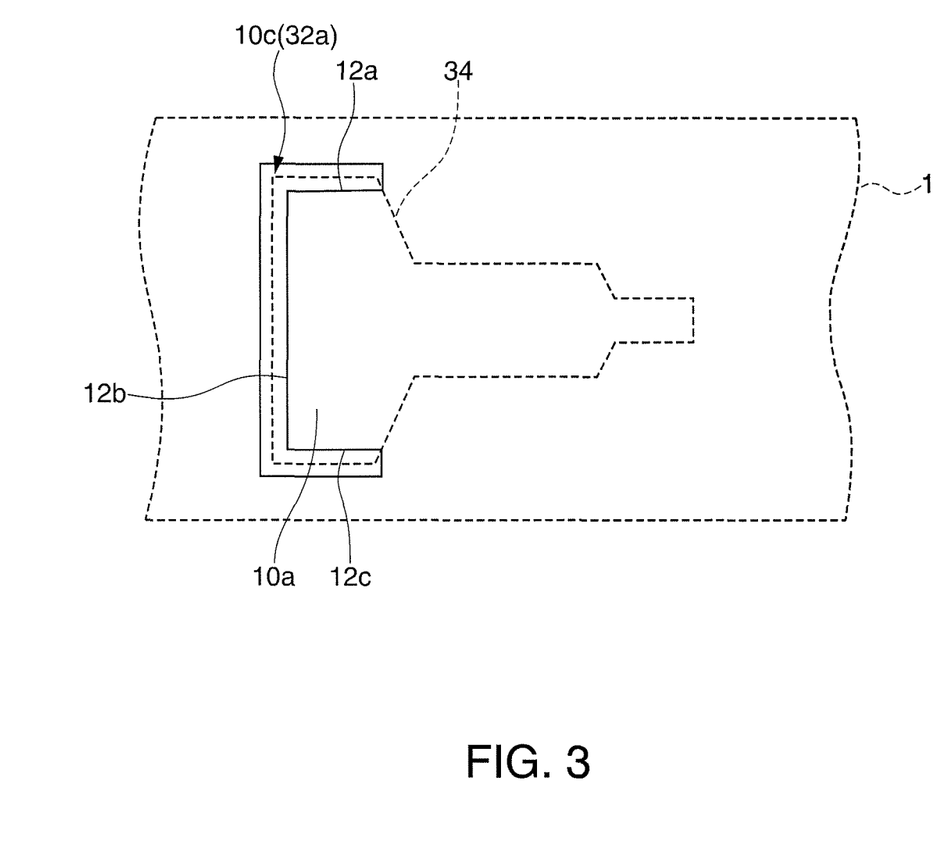
FIG. 3 is a plan view for describing the relation of positions of a portion 10c to be punched out by a die 32a and a die 34.

FIG. 3 is a plan view for describing the positional relation between the portion 10c punched out by the die 32a and the die 34. In the figure, the portion 10c punched out by the die 32a is shown by a solid line, and the die in a dotted line. In the example shown in the figure, the portion 10c punched out by the die 32a generally has a channel shape, wherein three inner sides of the portion 10c punched out by the die 32a define the sides 12a, 12b and 12c of the socket 10a.

Also, the die 34 has a portion that overlaps the portion 10c punched out by the die 32a, but does not overlap the socket 10a. Therefore, the flexible substrate 10 can be reliably punched out from the flexible tape 1 when punched out by the die 34.

Figure 4:
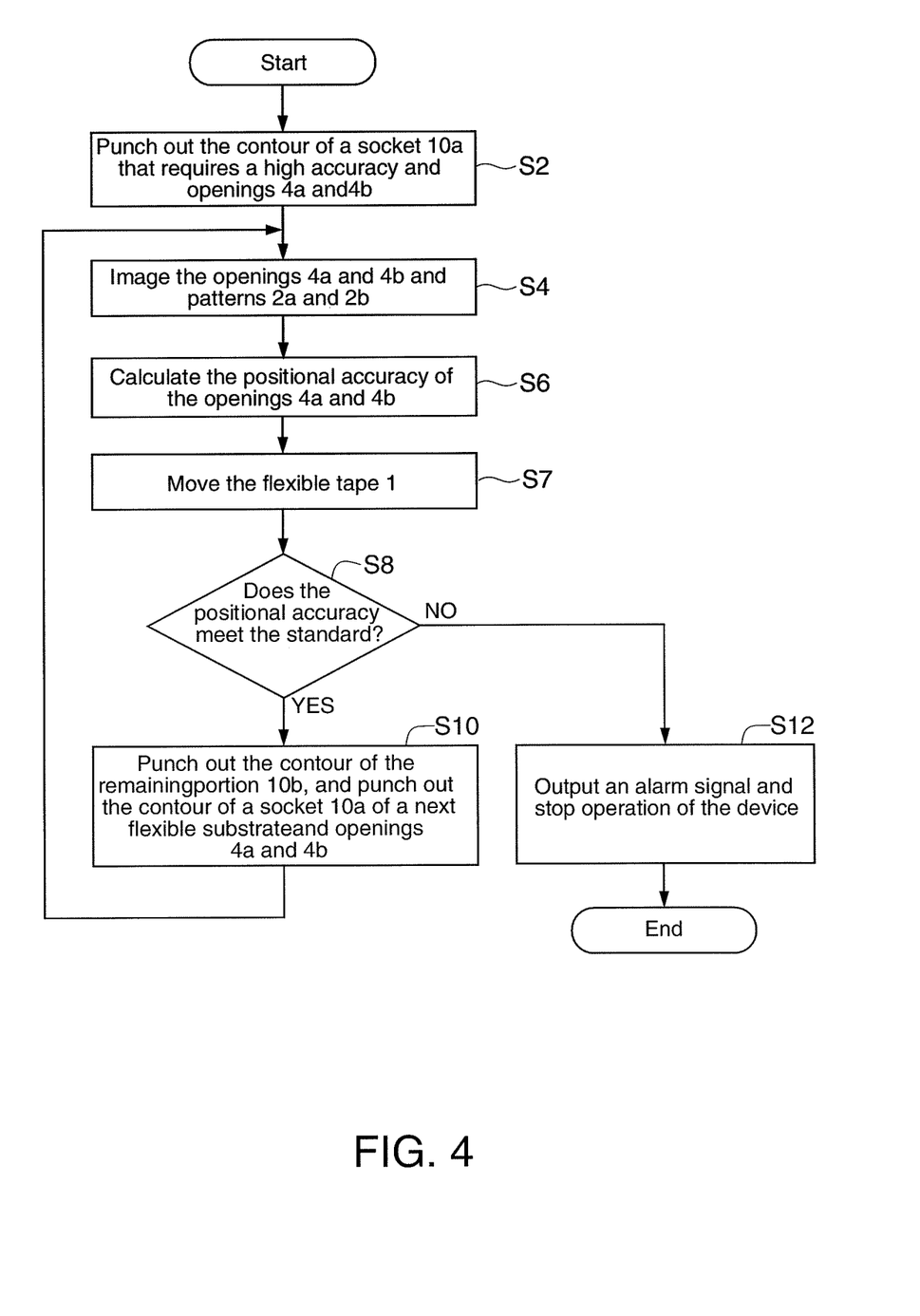
FIG. 4 is a flow chart of operations of the flexible substrate punching device shown in FIG. 2.

FIG. 4 is a flow chart of operations of the flexible substrate punching device shown in FIG. 2. First, the control section 30 controls the moving device 36 to dispose a first area of the flexible substrate 10 to be punched out below the die 32a. Then, the control section 30 controls the driving device 35 to move the dies 32a, 32b and 32c lower. By this, the contour of the socket 10a and the openings 4a and 4b are punched out in the flexible tape 1 (S2). It is noted that, in this step, the die 34 also moves down.

Thereafter, the control section 30 controls the driving section 35 to move up the dies 32a, 32b and 32c. Then the control section 30 has the imaging device 33 take an image of the openings 4a and 4b and the patterns 2a and 2b, and receives generated image data from the imaging device 33 (S4).

Then, the control section 30 processes the image data received, and calculates errors in the punching position of the openings 4a and 4b, in other words, the accuracy of the punching position (S6). While the process is being executed, the control section 30 controls the moving device 36 to position the area in which the contour of the socket 10a and the openings 4a and 4b have been punched out to a location below the die 34 (S7). In this state, an area where a next flexible substrate 10 is to be punched out is disposed below the die 32a.

When the accuracy of the punching position of the openings 4a and 4b meets the standard, in other words, the error in the punching position is less than the standard value (S8: Yes), the control section 30 controls the driving device 35 to move the die 34 lower. By this, the contour of a remaining portion 10b of the flexible substrate 10 to be punched out first is punched out, whereby the flexible substrate 10 is separated from the flexible tape 1. Also, at the same time, the dies 32a, 32b and 32c are moved down, whereby the contour of the socket 10a and the openings 4a and 4b are punched out (S10) in the area where the next flexible substrate 10 is to be punched out. Then, the process returns to the step S4.

When the accuracy of the punching position of the openings 4a and 4b does not meet the standard, in other words, the error in the punching position exceeds the standard value (S8: No), the control section 30 stops the operation of the flexible substrate punching device. Also, the control section 30 outputs an alarm signal to the alarm section 38 to have the alarm section 38 output an alarm (S12). Therefore, when the accuracy of the punching position of the openings 4a and 4b, in other words, the positional accuracy of the contour of the socket 10a does not meet the standard, the flexible substrate 10 is not separated from the flexible tape 1 by the die 34. Thereafter, for example, the operator may manually separate the flexible substrate 10 from the flexible tape 1.

According to the present embodiment, when punching out the flexible substrate 10, first, the contour of the socket 10a that requires a relatively high positional accuracy is punched out. Then, only when the positional accuracy of the contour of the socket 10a meets the standard, the remaining portion is punched out, whereby the flexible substrate 10 is separated from the flexible tape 1. Accordingly, when the positional accuracy of the contour of the socket 10a does not meet the standard, the flexible substrate 10 is not separated from the flexible tape 1 by the die 34. Therefore, defective articles can be readily sorted out. Also, the flexible substrate 10 that has been punched out proves that the positional accuracy of the contour of the socket 10a meets the standard. Therefore, the positional accuracy of the contour of the socket 10a does not need to be examined after the flexible substrate 10 has been punched out. Also, the accuracy of punching position is measured by image processing, such that high throughput can be obtained.

Figure 5:
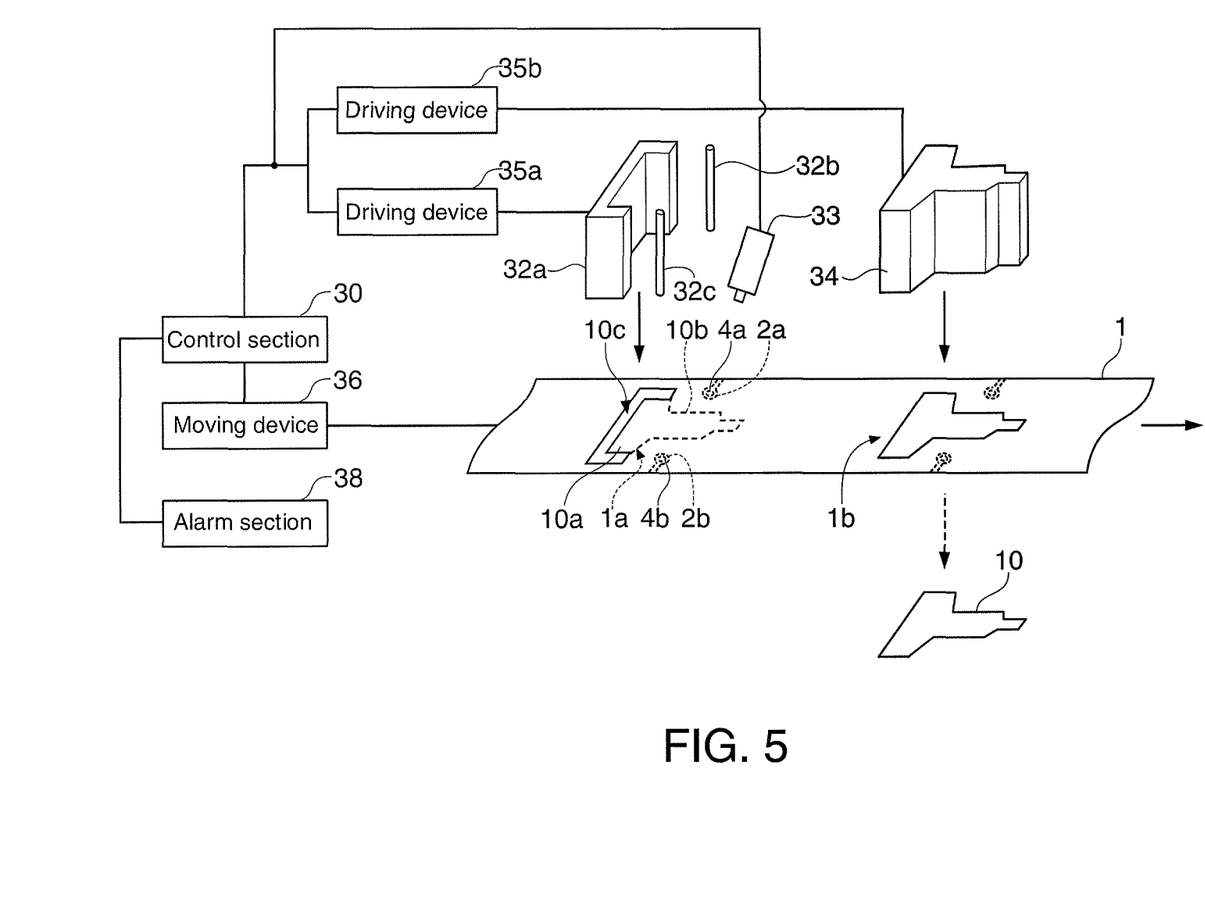
FIG. 5 is a schematic diagram of the structure of a flexible substrate punching device in accordance with a second embodiment of the invention.

FIG. 5 is a schematic diagram of the structure of a flexible substrate punching device in accordance with a second embodiment of the invention. The flexible substrate punching device shown in the figure has generally the same structure of the flexible substrate punching device shown in FIG. 2 in accordance with the first embodiment, except that a driving device 35a for moving the dies 32a, 32b and 32c, and a driving device 35b for moving the die 34 are provided independently from each other, and the control section 30 can drive the die 34 independently from the dies 32a, 32b and 32c. Components similar to those of the first embodiment are referenced with the same reference numerals used in the first embodiment, and their description shall be omitted.

Figure 6:
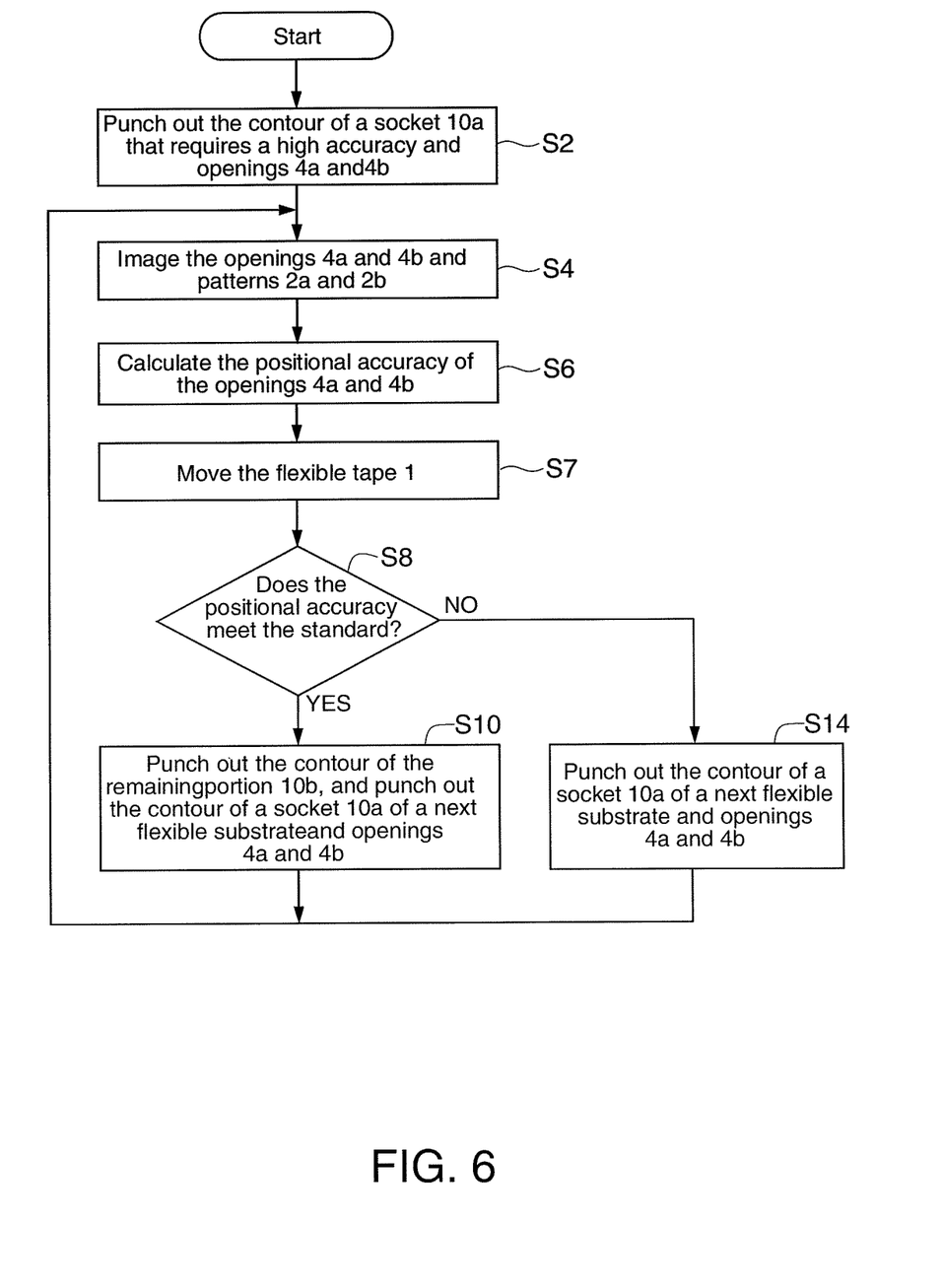
FIG. 6 is a flow chart of operations of the flexible substrate punching device shown in FIG. 5.

FIG. 6 is a flow chart of operations of the flexible substrate punching device shown in FIG. 5. The operations shown in the figure are generally the same as those of the flow chart shown in FIG. 4, except operations to be executed when the accuracy of punching position of openings 4a and 4b does not meet the standard. Processings similar to those shown in FIG. 4 are referenced with the same step numbers used in the first embodiment, and their description shall be omitted.

When the accuracy of the punching position of the openings 4a and 4b does not meet the standard (S8: No), the control section 30 operates only the driving device 35a to punch out the contour of a socket 10a and openings 4a and 4b in an area where a next flexible substrate 10 is to be punched out (S14). In this step, the driving device 35b is not operated, such that the flexible substrate 10 remains to be connected to the flexible tape 1 in an area where the first flexible substrate 10 is to be punched out. Then, the process returns to the step S4. The second embodiment can also provide effects similar to those of the first embodiment.

It is noted that the invention is not limited to the embodiments described above, and many changes can be made within the scope that does not depart from the subject matter of the invention. For example, in each of the embodiments described above, the dies 32a, 32b, 32c and 34 are moved up and down, whereby the flexible substrate 10 is punched out from the flexible tape 1. However, the flexible tape 1 may be moved up and down, thereby punching out the flexible substrate 10 from the flexible tape 1. Also, the patterns 2a and 2b may be in a shape simpler than that of the socket 10a, and may not be circular.

What is claimed is:

1. A method for manufacturing a flexible substrate including punching out a flexible substrate from a flexible tape, wherein the flexible substrate has a first contour that is a part of a contour of the flexible substrate, and a second contour that is a remaining portion of the contour other than the first contour, and requires a punching accuracy lower than a punching accuracy of the first contour, the method comprising the steps of:

operating a first die by a control section to punch out the first contour from the flexible tape;

judging by the control section as to whether a punching accuracy of the first contour meets a standard; and operating a second die by the control section to punch out the second contour from the flexible tape thereby separating the flexible substrate from the flexible tape when the control section judges that the punching accuracy of the first contour meets the standard, and not operating the second die when the control section judges that the punching accuracy of the first contour does not meet the standard;

wherein the flexible tape is provided with a reference pattern of a simpler configuration than a configuration of the first contour in an area other than an area of the flexible substrate to be punched out;

the control section controls in the step of punching out the first contour the first die to punch out the first contour and the reference pattern;

in the step of judging as to whether the punching accuracy of the first contour meets the standard, the control section judges as to whether the punching accuracy meets the standard by measuring the punching accuracy of the reference pattern by image processing.

2. The method of claim 1, wherein the judging step is subsequent to the step of operating the first die.

3. The method of claim 1, wherein the flexible tape is further provided with a reference mark that exists prior to operating the first die, wherein measuring the punching accuracy of the reference pattern comprises measuring a distance between at least a certain portion of the reference pattern and at least a certain portion of the reference mark.

4. The method of claim 3, wherein the reference pattern and the reference mark are both substantially circular, and measuring the punching accuracy of the reference pattern comprises measuring the distance between a center of the reference pattern and a center of the reference mark.

* * * * *